(12) United States Patent
Tokunoh

(10) Patent No.: US 6,465,881 B1
(45) Date of Patent: Oct. 15, 2002

(54) COMPRESSION BONDED TYPE SEMICONDUCTOR DEVICE

(75) Inventor: Futoshi Tokunoh, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 31 days.

(21) Appl. No.: 09/664,073

(22) Filed: Sep. 18, 2000

Related U.S. Application Data

(63) Continuation of application No. PCT/JP99/00119, filed on Jan. 18, 1999.

(51) Int. Cl.$^7$ .................... H01L 23/48; H01L 23/22; H01L 23/24; H01L 23/52; H01L 29/40; H01L 23/552

(52) U.S. Cl. .................. 257/688; 257/785; 257/659; 257/687

(58) Field of Search .................. 257/688, 689, 257/690, 692, 693, 698, 700, 701, 785, 741, 734, 767, 728, 731, 732, 659, 660, 677, 735, 740, 762, 763, 770

(56) References Cited

U.S. PATENT DOCUMENTS 4,719,500 A  * 1/1988 Tokunoh .................. 257/182
5,574,297 A  * 11/1996 Sennenbara et al. ........ 257/135
5,640,024 A    6/1997 Morishita et al.
5,777,351 A  * 7/1998 Taguchi et al. ............. 257/150

FOREIGN PATENT DOCUMENTS

JP       2-51275     2/1990
JP       3-285357    12/1991

* cited by examiner

Primary Examiner—Nathan J. Flynn
Assistant Examiner—Victor A. Mandala Jr.
(74) Attorney, Agent, or Firm—Oblon, Spivak, McClelland, Maier & Neustadt, P.C.

(57) ABSTRACT

A compression bonded type semiconductor device including a semiconductor substrate having a gate electrode and a cathode electrode formed on a first surface and an anode electrode formed on a second surface opposite to the first surface, an external cathode electrode disposed so as to be compression bondable to the cathode electrode, and an external anode electrode disposed so as to be compression bondable the anode electrode. Also included is an insulating cylinder containing the semiconductor substrate, an external gate terminal having an outer peripheral portion protruding to an outside of the insulating cylinder and having a protrusion at an inner peripheral portion configured to about said gate electrode, and an elastic body configured to press the protrusion of the external gate terminal to the gate electrode.

26 Claims, 3 Drawing Sheets

COMPRESSION BONDED TYPE SEMICONDUCTOR DEVICE

CROSS-REFERENCE TO A RELATED APPLICATION

This application is a continuation of international application PCT/JP99/00119, filed on Jan. 18,1999, the entire contents of which are incorporated by reference.

BACKGROUND OF THE INVENTION

1. Field of the Invention:

The present invention relates to a compression bonded type semiconductor device, such as GCT (Gate Commutated Turn-off) thyristor.

2. Description of the Background

Although a GTO (Gate Turn-OFF) thyristor has been widely used as a device for large capacity power electronics, the GTO requires a snubber circuit. Further, it is difficult to suppress an increase of snubber loss due to an increase in an operating voltage of the GTO. However, a GCT (Gate Commutated Turn-off) thyristor does not require such a snubber circuit and realizes a performance of 6000 A for a maximum breaking current and less than or equal to 3 $\mu$s for a turn-off storage time. The GCT also has an increased capacity and speed.

FIG. 3 is a cross-sectional view illustrating a background compression bonded type semiconductor device (e.g., a GCT) described in Japanese Patent Laid-Open No. Hei. 8-330572 (1996). In the figure, reference numeral 1 denotes a semiconductor substrate. An aluminum gate electrode 2a is formed at an outer peripheral portion on a surface of the semiconductor substrate 2, a cathode electrode 2b is formed at an inside of the gate electrode 2a, and an anode electrode 2c is formed on a back surface of the substrate 2. Also shown are a cathode distortion buffer disk 3 and an external cathode electrode 4 mounted one after another on a side of the cathode electrode 2b, and an anode distortion buffer disk 5 and an external anode electrode 6 mounted one after another on a side of the anode electrode 2c. A ring gate electrode 7 made of iron or nickel alloy contacts the gate electrode 2a, and a ring-shaped external gate terminal 8 made of iron or nickel alloy is electrically connected with the ring gate electrode 7, though it is not fixed thereto. In addition, an elastic body 9 (such as a disk spring) presses the ring gate electrode 7 to the gate electrode 2a together with the external gate terminal 8 via an annular insulator 10.

Further shown is an insulator 11 for insulating the ring gate electrode 7 from the cathode distortion buffer disk 3 and the external cathode electrode 4, a first flange 12 secured to the external cathode electrode 4, a second flange 13 secured to the external anode electrode 6, and an insulating cylinder 14 made of ceramics or the like and which is divided into upper and lower parts. An outer periphery of the external gate terminal 8 protrudes out of a side of the insulating cylinder 14 and is hermetically secured to a divisional portion 14a by soldering. In addition, an end portion 15 secured to the insulating cylinder 14 by soldering is hermetically secured to the first and second flanges 12 and 13 by arc welding. Thus, the GCT 1 has a closed structure and the inside is filled with an inert gas.

Next, the operation of the GCT 1 will be explained. Current flows toward the external cathode electrode 4 from the external gate terminal 8 when the GCT 1 is turned on. A gradient of rise of the gate current at this time is generally set at 1000 A/$\mu$s or more in operating the GCT 1 without a current limiting reactor and the turn-on spreading speed of the GCT 1 must be increased. While current flows toward the external gate terminal 8 from the external cathode electrode 4 when the GCT 1 is turned off, the current must be fed with the gradient of several thousands A/$\mu$s to commutate a current equivalent to the main current of the GCT 1 to the gate in about 1 $\mu$s to operate it without a snubber circuit. A contact resistance of a current feeding path from the external gate terminal 8 to the external cathode electrode 4 must be minimized to feed such a large current instantly.

While the cathode electrode 2b, the cathode distortion buffer disk 3 and the external cathode electrode 4 are pressed by a large force of several hundreds kg/cm$^2$ from outside of the GCT 1, the gate electrode 2a, the ring gate electrode 7, and the external gate terminal 8 are pressed only by the elastic body 9. This is because the elastic body 9 is disposed at a peripheral part of the external cathode electrode 4. Thus, the pressure at a portion A, where the external gate terminal 8 contacts the ring gate electrode 7, is several kg/cm$^2$ and a contact resistance sufficient to feed the above-discussed instantaneous large power cannot be obtained.

The above-constructed background GCT 1 also has the following problems.

First, there is a case in which the external gate terminal 8 causes a waviness in a circumferential direction at the contact portion A between an inner peripheral portion of the external gate terminal 8 and the ring gate electrode 7 due to a strain caused by a thermal residual stress from soldering the external gate terminal 8 and the divisional portion 14a of the insulating cylinder 14. In addition, because the external gate terminal 8 is only pressed by the elastic body 9, the pressure at the contact portion A is several kg/cm$^2$ and the waviness can not be corrected. Therefore, the contact resistance of the contact portion A is greater than a desired contact resistance. That is, the contact resistance of the feeding path from the external gate terminal 8 to the external cathode electrode 4 is too large. Thus, the power feeding capability of the gate is inhibited, because the gradient of the inverse direction gate current is insufficient when the GCT 1 is turned off, for example.

Secondly, the abnormality of the contact caused by the waviness also results in a contact resistance which fluctuates within the plane of the ring-shaped external gate terminal 8. Thus, the power feeding capability of the gate partially drops, which causes an extreme drop in the turn-off capability of the GTC 1.

Thirdly, the GTC 1 abnormally generates heat by locally receiving electromagnetic induction from the magnetic field of an external circuit when operating at high frequencies, because iron or nickel alloy is used for the external gate terminal 8 to thereby solder with ceramics (which is the material of the insulating cylinder 14). This problem influences the characteristics of the semiconductor substrate 2.

SUMMARY OF THE INVENTION

Accordingly, one object of the present invention is to solve the above-noted and other problems.

Another object of the present invention is to provide a novel compression bonded type semiconductor device which decreases a contact resistance of a current feeding path from an external gate terminal to an external cathode electrode.

Yet another object of the present invention is to provide a novel compression bonded type semiconductor device which can suppress a fluctuation of contact resistance within the plane of the external gate terminal caused by waviness produced in the circumferential direction of the external gate terminal from occurring at a portion where the inner peripheral part of the external gate terminal contacts a ring gate electrode.

Still another object of the present invention is to provide a novel compression bonded type semiconductor device which prevents the external gate terminal from abnormally generating heat by locally receiving electromagnetic induction by the magnetic field of the external circuit when operating at a high frequency.

To achieve these and other objects, the present invention provides a novel gate electrode and a cathode electrode formed on a top surface of a semiconductor substrate, and an anode electrode formed on a back surface of the substrate. An external cathode electrode is disposed to be compression bondable to the cathode electrode and an external anode electrode is disposed to be compression bondable to the anode electrode. Also included is an insulating cylinder containing the semiconductor substrate, and an external gate terminal whose outer peripheral portion protrudes out of the side of the insulating cylinder and which is fixed to the insulating cylinder. The external gate terminal also has a protrusion formed at an inner peripheral portion and which abuts the gate electrode. In addition, the external gate terminal is pressed to the gate electrode by an elastic body. Thus, the external gate terminal directly contacts the gate electrode and a contact resistance which otherwise exists in the background art between the external gate terminal and the ring gate electrode is eliminated. Accordingly, it is possible to decrease the contact resistance of the feeding path from the external gate terminal to the external cathode electrode, and to improve the power feeding capability of the gate.

Further, a ring-shaped press-contact auxiliary block may also be provided between the protrusion of the external gate terminal and the elastic body. Thus, it is possible to reduce the fluctuation of a press-contact force at the portion where the external gate terminal contacts the gate electrode. This suppresses the fluctuation of the contact resistance within the plane of the external gate terminal from occurring, due to the waviness at the inner peripheral part of the external gate terminal by the strain caused by thermal residual stress in soldering the external gate terminal with the insulating cylinder.

Furthermore, the external gate terminal may include a first ring-shaped portion and the protrusion may include a second ring-shaped portion formed at an inner peripheral portion of the first ring-shaped portion. Thus, the external gate terminal directly contacts the gate electrode and a contact resistance is decreased.

In addition, the protrusion abutting the gate electrode may have a ring-shape. Thus, the press-contact force at the portion where the external gate terminal contacts the gate electrode may be increased by about several tens of times compared. with the background art. Thus, it is possible to obtain a contact resistance sufficient to feed a large power instantly, by correcting the waviness which otherwise occurs at the inner peripheral part of the external gate terminal due to the strain caused by the thermal residual stress in soldering the external gate terminal with the insulating cylinder.

Further, the external gate terminal may include a non-magnetic material, which suppresses the external gate terminal from abnormally generating heat by locally receiving electromagnetic induction by the magnetic field of an external circuit when operating at a high frequency.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
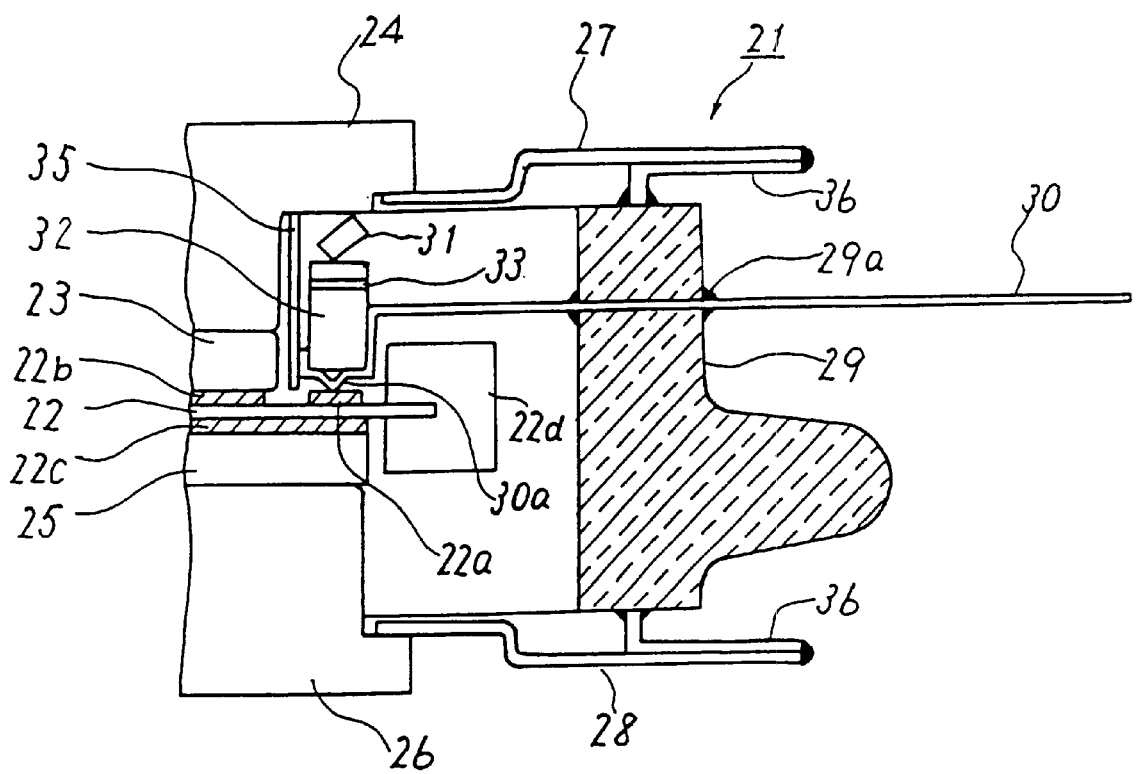
FIG. 1 is a cross-sectional view of a compression bonded type semiconductor device according to a first embodiment of the invention.

Referring now to the drawings, wherein like reference numerals designate identical or corresponding parts throughout the several views, the first and second embodiments of the present invention will be discussed.

First Embodiment

FIG. 1 is a cross-sectional view of a compression bonded type semiconductor device (e.g., a GCT) according to a first embodiment of the present invention. In FIG. 1, reference numeral 21 denotes the GCT, and reference numeral 22 denotes a disk-like semiconductor substrate, in which an aluminum gate electrode 22a is formed at a peripheral surface portion of the substrate 22, a cathode electrode 22b is formed at an inside of the gate electrode 22a, and an anode electrode 22c is formed on a back surface of the substrate 22. As shown, a cathode distortion buffer disk 23 made of molybdenum and an external cathode electrode 24 made of copper are mounted one after another on a side of the cathode electrode 22b, and an anode distortion buffer disk 25 made of molybdenum and an external anode electrode 26 made of copper are mounted one after another on a side of the anode electrode 22c. Also shown is a first flange 27 made of iron, nickel or the like and which is secured to the external cathode electrode 24, a second flange 28 made of iron, nickel or the like and which is secured to the external anode electrode 26, and an insulating cylinder 29 made of ceramics or the like and which is divided into upper and lower parts at a divisional portion 29a.

Further illustrated is a ring-shaped external gate terminal 30 made of a non-magnetic ring shaped plate including a material which does not receive electromagnetic induction (such as copper, molybdenum, tungsten or their alloy, e.g., phosphor bronze) as a main component. An outer periphery of the external gate terminal 30 protrudes out of a side of the insulating cylinder 29 and is hermetically secured to the divisional portion 29a by soldering. A ringshaped protrusion 30a is formed at an inner peripheral section of the external gate terminal 30 and an edge portion of the protrusion 30a abutting the gate electrode 22a has a ring-shaped flat portion of about 0.5 mm. An elastic body 31 (such as a disk spring or a wave spring) presses the external gate terminal 30 to the gate electrode 22a via a press-contact auxiliary block 32. The press-contact auxiliary block 32 comprises a ring-shape and is made of a rigid material such as molybdenum. The thermal expansion ratio of the auxiliary block 32 is close to that of silicon. Further, the auxiliary block 32 is disposed between the elastic body 31 and the protrusion 30a of the external gate terminal 30, and a ring-shaped insulator 33 electrically insulates the elastic body 31 and the press-contact auxiliary block 32.

In addition, an insulator 35 made of an insulating sheet such as Teflon or polyimide is provided between the inner peripheral part of the external gate terminal 30 and the external cathode electrode 24 to electrically insulate the inner peripheral part of the external gate terminal 30 from the external cathode electrode 24. A first edge portion 36 made of iron, nickel or the like has one end hermetically secured to the insulating cylinder 29 and the other end hermetically secured to the first flange 27. A second edge portion 36 is similarly secured to the second flange 28 and the insulating cylinder 29. Thus, the GCT 21 has a closed structure and the inside thereof is replaced by inert gas.

Next, an operation of the GCT 21 will be explained. Current flows toward the external cathode electrode 24 from the external gate terminal 30 when the GCT 21 is turned on. A gradient of rise of the gate current at this time is set at about 1000 A/µs or more in operating the GCT 21 without a current limiting reactor, for example, and the turn-on spreading speed of the GCT 21 must be increased. While current flows toward the external gate terminal 30 from the external cathode electrode 24 when the GCT 21 is turned off, the current must be fed with the gradient of several thousands A/µs to commutate a current equivalent to the main current of the GCT 21 to the gate in about 1 µs to operate it without a snubber circuit, which aids the turn-off of the GCT 21. A contact resistance of a current feeding path from the external gate terminal 30 to the external cathode electrode 24 must be minimized to instantly feed such a large current.

Figure 3:
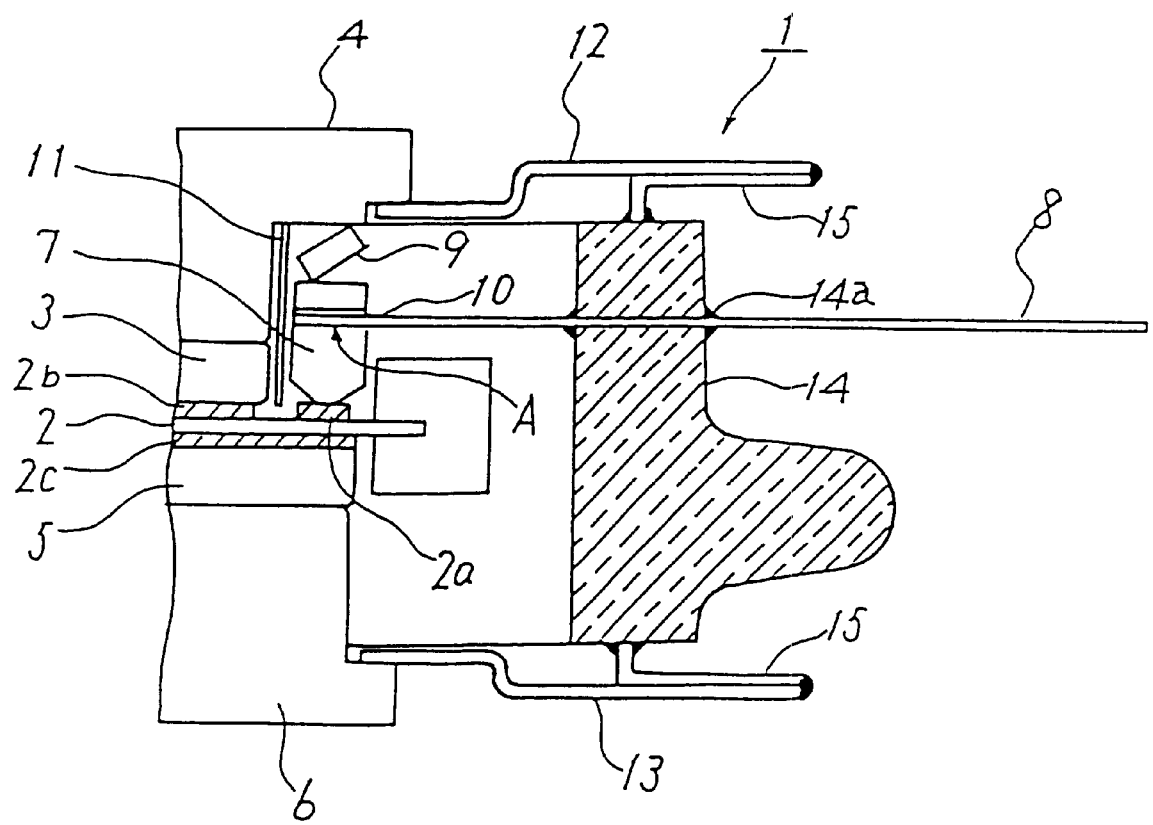
FIG. 3 is a cross-sectional view of a background compression bonded type semiconductor device.

According to the first embodiment of the present invention, the external gate terminal 30 has a protrusion 30a which abuts the gate electrode 22a. This configuration allows the external gate terminal 30 to directly contact the gate electrode 22a. Thus, a contact resistance interposed between the external gate terminal 8 and the ring gate electrode 7 shown in the background art in FIG. 3 is eliminated. Therefore, it is possible to decrease the contact resistance of the feeding path from the external gate terminal 30 to the external cathode electrode 24 and to improve the power feeding capability of the gate.

Further, the ring-shaped press-contact auxiliary block 32 is provided between the protrusion 30a and the elastic body 31. This configuration lessens the fluctuation of presscontact forces at the portion where the external gate terminal 30 (made of a thin plate) contacts the gate electrode 22a. Thus, it is possible to. suppress the fluctuation of the contact resistance within the plane of the external gate terminal 30 from occurring due to waviness at the inner peripheral part of the external gate terminal 30. As previously discussed, the waviness is due to the strain caused by thermal residual stress in soldering the external gate terminal 30 with the insulating cylinder 29.

Further, the protrusion 30a comprises a ring-shape and an edge portion of the protrusion 30a contacting the gate electrode 22a is a ring-shaped flat portion of about 0.5 mm. Thus, the press-contact force at the portion where the external gate terminal 30 contacts the gate electrode 22a is increased by about several tens of times as compared to the background art. Thus, it is possible to obtain a contact resistance sufficient to feed a large power instantly by correcting the waviness, which otherwise occurs at the inner peripheral part of the external gate terminal 30 due to the strain caused by the thermal residual stress in soldering the external gate terminal 30 with the insulating cylinder 29.

In addition, the external gate terminal 30 is a non-magnetic member. Thus, the external gate terminal 30 is suppressed from abnormally generating heat by locally receiving electromagnetic induction by the magnetic field of an external circuit operating at a high frequency.

Further, the GCT 21 shown in the first embodiment is made by assembling the insulator 35, the elastic body 31, the ring-shaped insulator 33 and the press-contact auxiliary block 32, while placing at the lower side the external cathode electrode 24 (to which the first flange 27 is secured), resulting in a semi-finished item in which the external gate terminal 30 and the edge portion 36 are secured to the insulating cylinder 29. Then the first flange 27 is secured to the edge portion 36 at a desired position. This allows the external cathode electrode 24 and the external gate terminal 30 to be positioned. Therefore, it is possible to position the gate electrode 22, the external gate terminal 30 and the external cathode electrode 24 accurately from each other because a mold portion 22d provided at the outer peripheral portion of the gate electrode 22 engages with the external gate terminal 30.

Second Embodiment

Next, a compression bonded type semiconductor device according to the second embodiment of the present invention will be explained.

Figure 2:
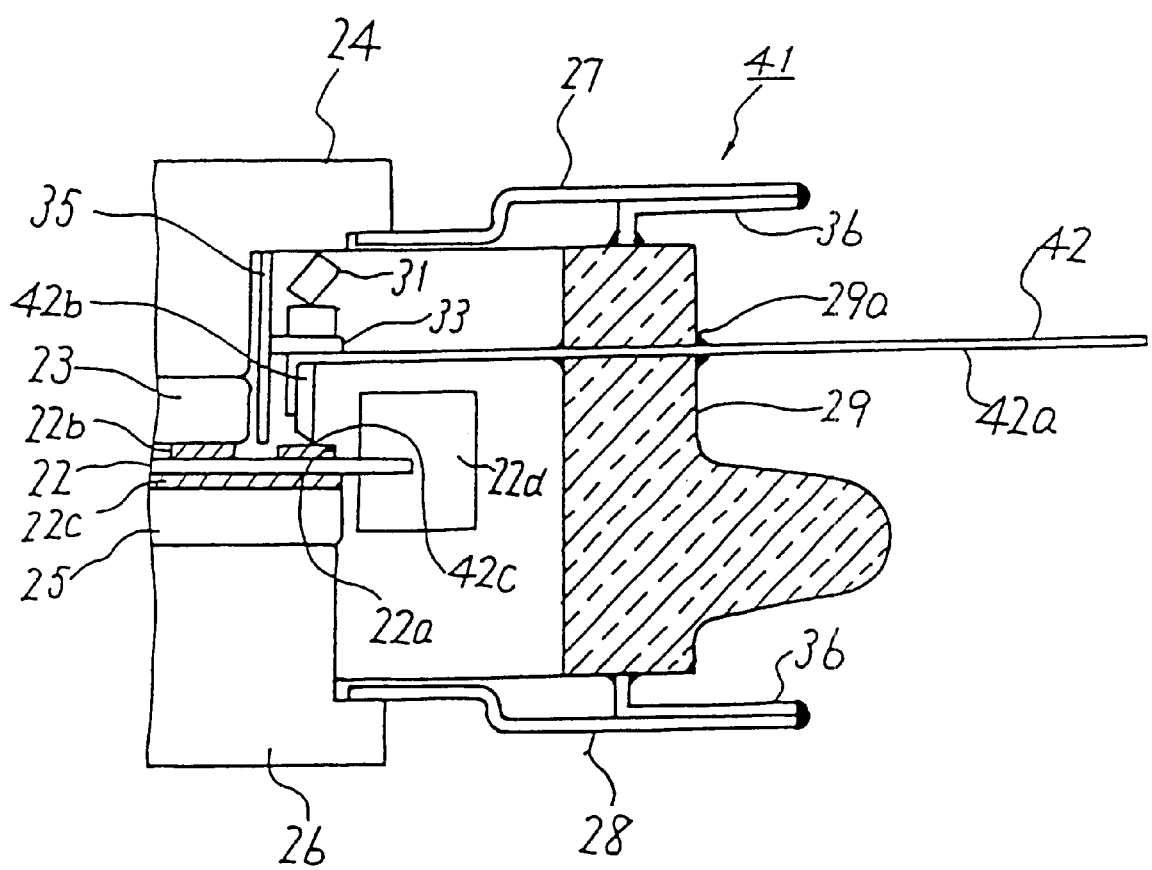
FIG. 2 is a cross-sectional view of a compression bonded type semiconductor device according to a second embodiment of the invention.

FIG. 2 is a cross-sectional view of a GCT according to the second embodiment of the present invention. The same reference numerals as those used in FIG. 1 denote the same or corresponding components. The difference between FIGS. 1 and 2 is that the press-contact auxiliary block 32 is eliminated and the structure of the external gate terminal 30 is changed. In more detail, reference numeral 41 denotes the GTC, and reference numeral 42 denotes a ring-shaped external gate terminal formed of a non-magnetic ring-shaped plate having a main material which does not receive electromagnetic induction, such as copper, molybdenum, tungsten or their alloy, e.g., phosphor bronze. An outer periphery 42a of the external gate terminal 42 protrudes out of a side of the insulating cylinder 29 and is hermetically secured to a divisional part 29a by soldering. In addition, a ring-shaped protrusion 42c, which abuts the gate electrode 22a, is formed at an inner periphery part of a ring-shaped gate portion 42b. The ring-shaped gate portion 42b includes a nonmagnetic ring-shaped plate made of a material which does not receive electromagnetic induction such as copper, molybdenum, tungsten or their alloy, e.g., phosphor bronze, as the main material. The ring-shaped gate portion 42b is soldered to an inner periphery of the external terminal 42. An edge portion of the protrusion 42c abutting the gate electrode 22a has a ring-shaped flat portion of about 0.5 mm.

According to the second embodiment, the ring-shaped protrusion 42c (which abuts the gate electrode 22a) is formed in a body with the ring-shaped gate portion 42b soldered to the inner peripheral part of the external gate terminal 42. Such a configuration allows the external gate terminal 42 to directly contact the gate electrode 22a and a contact resistance which otherwise exists between the external gate terminal 8 and the ring gate electrode 7 in the background art is eliminated. Therefore, it is possible to decrease the contact resistance of the power feeding path from the external gate terminal 42 to the external cathode electrode 24, and to improve the power feeding capability of the gate.

In addition, the gate electrode may be formed at an intermediate portion of the surface of the semiconductor substrate, rather than at the outer peripheral portion as discussed in the first and second embodiments.

Further, the present invention is also applicable to a compression bonded type semiconductor device having a main electrode and a control electrode such as a compression bonded type GTO or compression bonded type IGBT.

Obviously, numerous modifications and variations of the present invention are possible in light of the above teachings. It is therefore to be understood that within the scope of the appended claims, the invention may be practiced otherwise than as specifically described herein.

What is claimed is:

1. A compression bonded type semiconductor device, comprising:
    a semiconductor substrate having a gate electrode and a cathode electrode formed on a first surface and an anode electrode formed on a second surface opposite to the first surface;
    an external cathode electrode disposed so as to be compression bondable to the cathode electrode;
    an external anode electrode disposed so as to be compression bondable to said anode electrode;
    an insulating cylinder containing said semiconductor substrate;
    an external gate terminal having a first portion protruding to an outside of the insulating cylinder integrally formed with a second portion having a ring-shaped protrusion configured to abut said gate electrode; and
    an elastic body configured to press said protrusion of the external gate terminal to said gate electrode.

2. The device according to claim 1, further comprising:
    a ring-shaped press-contact auxiliary block disposed between said elastic body and the protrusion of the external gate terminal.

3. The device according to claim 1, wherein the external gate terminal comprises a non-magnetic material.

4. The device according to claim 1, wherein the protrusion is singularly formed with the external gate terminal.

5. The device according to claim 1, wherein the external gate terminal comprises a first ring-shaped portion and the protrusion comprises a second ring-shaped portion formed at an inner peripheral portion of the first ring-shaped portion of the external gate terminal.

6. The device according to claim 5, wherein the external gate terminal including the first ring-shaped portion and the second ring-shaped portion comprise a non-magnetic material.

7. The device according to claim 1, wherein portions of the external gate terminal at inner and outer peripheries of the insulating cylinder comprises solder joints so as to hermetically fix the external gate terminal to the insulating cylinder.

8. The device according to claim 1, wherein the external gate terminal comprises a material selected from the group consisting of copper, molybdenum, tungsten, and phosphor bronze.

9. The device according to claim 1, further comprising:
    a first flange having a first end secured to the external cathode electrode and having a second end secured to the insulating cylinder;
    a second flange having a first end secured to the external anode electrode and having a end secured to the insulating cylinder.

10. The device according to claim 9, wherein the second ends of the first and second flanges are respectively secured to the insulating cylinder via first and second edge portions so as to provide an enclosed structure.

11. The device according to claim 1, further comprising:
    an insulator provided between the second portion of the external gate terminal and the external cathode electrode and configured to electrically insulate the second portion of the external gate terminal from the external cathode electrode.

12. The device according to claim 1, further comprising:
    a cathode distortion buffer disk disposed between the cathode electrode and the external cathode electrode; and
    an anode distortion buffer disk disposed between the anode electrode and the external anode electrode.

13. The device according to claim 12, wherein the insulating cylinder further contains the cathode distortion buffer disk and the anode distortion buffer disk.

14. A compression bonded type semiconductor device, comprising:
    a semiconductor substrate having a gate electrode and a cathode electrode formed on a first surface and an anode electrode formed on a second surface opposite to the first surface;
    an external cathode electrode disposed so as to be compression bondable to the cathode electrode;
    an external anode electrode disposed so as to be compression bondable to said anode electrode;
    an insulating cylinder for containing said semiconductor substrate;
    an external gate terminal having a first portion protruding to an outside of the insulating cylinder integrally formed with a second portion having a ring-shaped protrusion for abutting said gate electrode; and
    means for pressing said second portion of the external gate terminal to said gate electrode.

15. The device according to claim 14, further comprising:
    a ring-shaped press-contact auxiliary block disposed between said elastic body and said second portion of said external gate terminal.

16. The device according to claim 14, wherein the external gate terminal comprises a non-magnetic material.

17. The device according to claim 14, wherein the second portion of the external gate terminal is singularly formed with the external gate terminal.

18. The device according to claim 14, wherein the external gate terminal comprises a first ring-shaped portion and the second portion comprises a second ring-shaped portion formed at an inner peripheral portion of the first ring-shaped portion of the external gate terminal.

19. The device according to claim 18, wherein the external gate terminal including the first ring-shaped portion and the second ring-shaped portion comprise a non-magnetic material.

20. The device according to claim 14, further comprising:
    means for hermetically fixing the external gate terminal to the insulating cylinder at inner and outer peripheries of the insulating cylinder.

21. The device according to claim 14, wherein the external gate terminal comprises a material selected from the group consisting of copper, molybdenum, tungsten, and phosphor bronze.

22. The device according to claim 14, further comprising:
    a first flange having a first end secured to the external cathode electrode and having a second end secured to the insulating cylinder;
    a second flange having a first end secured to the external anode electrodeland having a second end secured to the insulating cylinder.

23. The device according to claim 22, wherein the second ends of the first and second flanges are respectively secured to the insulating cylinder via first and second edge portions so as to provide an enclosed structure.

24. The device according to claim 14, further comprising:
means for electrically insulating the inner peripheral part of the external gate terminal from the external cathode electrode.

25. The device according to claim 14, further comprising:
a cathode distortion buffer disk disposed between the cathode electrode and the external cathode electrode; and
an anode distortion buffer disk disposed between the anode electrode and the external anode electrode.

26. The device according to claim 25, wherein the containing means further contains the cathode distortion buffer disk and the anode distortion buffer disk.

* * * * *